(12) United States Patent
Kim et al.

(10) Patent No.: US 9,140,902 B2
(45) Date of Patent: Sep. 22, 2015

(54) WINDOW FOR COVERING DISPLAY DEVICE, METHOD FOR MANUFACTURING WINDOW, DISPLAY DEVICE, AND METHOD FOR MANUFACTURING DISPLAY DEVICE

(71) Applicant: SAMSUNG DISPLAY CO., LTD., Yongin, Gyeonggi-Do (KR)

(72) Inventors: Yun-Ho Kim, Yongin (KR); Hwan-Jin Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 63 days.

(21) Appl. No.: 14/023,377

(22) Filed: Sep. 10, 2013

(65) Prior Publication Data

US 2014/0078585 A1    Mar. 20, 2014

(30) Foreign Application Priority Data

Sep. 18, 2012    (KR) .......................... 10-2012-0103217

(51) Int. Cl.
*G02B 27/00* (2006.01)
*G09F 9/33* (2006.01)
*H01L 51/52* (2006.01)

(52) U.S. Cl.
CPC .............. *G02B 27/0006* (2013.01); *G09F 9/33* (2013.01); *H01L 51/5237* (2013.01)

(58) Field of Classification Search
CPC .................................................. G02B 27/0006
USPC .................. 359/507, 513, 580; 427/108, 510; 156/275.7

See application file for complete search history.

(56) References Cited

U.S. PATENT DOCUMENTS

| 2008/0002137 | A1* | 1/2008 | Kim et al. ...................... 349/187 |
| 2009/0041984 | A1* | 2/2009 | Mayers et al. ................. 428/141 |
| 2010/0029339 | A1* | 2/2010 | Kim et al. ...................... 455/566 |
| 2011/0151937 | A1* | 6/2011 | Kusuda et al. ................. 455/566 |

FOREIGN PATENT DOCUMENTS

| KR | 10-2006-0007270 A | 1/2006 |
| KR | 10-2010-0005443 A | 1/2010 |
| KR | 10-2011-0111749 A | 10/2011 |
| KR | 10-2012-0036549 A | 4/2012 |
| KR | 10-1147416 B1 | 5/2012 |

* cited by examiner

*Primary Examiner* — Scott J Sugarman
*Assistant Examiner* — William R Alexander
(74) *Attorney, Agent, or Firm* — Knobbe, Martens, Olson & Bear LLP

(57) ABSTRACT

A window covers a display panel including a display area for displaying an image and a non-display area neighboring the display area by a resin. The window includes a window main body including a transmitting area corresponding to the display area and a blocking area neighboring the transmitting area and corresponding to the non-display area; a light blocking layer provided on the window main body corresponding to the blocking area; and a contamination preventing layer provided on a region of the window main body located near or at a border line between the transmitting area and the blocking area. The contamination preventing layer contacts the resin.

15 Claims, 10 Drawing Sheets

WINDOW FOR COVERING DISPLAY DEVICE, METHOD FOR MANUFACTURING WINDOW, DISPLAY DEVICE, AND METHOD FOR MANUFACTURING DISPLAY DEVICE

RELATED APPLICATIONS

This application claims priority to and the benefit of Korean Patent Application No. 10-2012-0103217 filed in the Korean Intellectual Property Office on Sep. 18, 2012, the entire contents of which are incorporated herein by reference.

BACKGROUND

1. Field

The described technology relates generally to a window for covering a display device, and a window manufacturing method.

2. Description of the Related Technology

As a display device which displays an image, an organic light emitting diode (OLED) display has come into the spotlight in recent years.

Since the organic light emitting diode (OLED) display has a self-light emitting characteristic so that a separate light source is not required, unlike a liquid crystal display (LCD), its thickness and a weight may be reduced. Further, because the OLED display has high quality characteristics such as low power consumption, high luminance, and high reaction speed, the OLED display is appropriate for use in a mobile electronic device.

Recently, a touch sensor has been formed on a display panel such as an organic light emitting diode (OLED) display so as to manufacture a slim display module such as a smart phone, and a display panel array manufactured by laminating a window on a display panel by using a resin is supplied to display module manufacturers.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a window that is easily laminated on a display panel by using a resin, a window manufacturing method, a display device, and a display device manufacturing method.

An exemplary embodiment provides a window for covering a display panel including a display area for displaying an image and a non-display area neighboring the display area. The window includes: a window main body including a major surface, wherein the window main body further comprises: a transmitting area corresponding to the display area when viewed in a viewing direction perpendicular to the major surface, and a blocking area neighboring the transmitting area when viewed in the viewing direction and corresponding to the non-display area; a light blocking layer provided over the blocking area of the window main body; and a contamination preventing layer provided over a region of the window main body, wherein the region is located between the transmitting area and the blocking area when viewed in the viewing direction, and wherein, when the window is coupled to the display panel using resin, the contamination preventing layer contacts the resin.

A surface of the contamination preventing layer has greater hydrophobicity than a surface of the window main body and a surface of the light blocking layer.

The surface of the contamination preventing layer has a contact angle of about 100 to about 200 degrees with respect to water.

The contamination preventing layer comprises fluorine (F).

The contamination preventing layer has a closed loop shape extending along an edge of the display area of the window main body.

The contamination preventing layer contacts the light blocking layer.

The contamination preventing layer contacts the window main body.

The light blocking layer defines at least one exposure hole through which a portion of the window main body is exposed in an island shape, and the window further includes a second contamination preventing layer provided in the exposure hole and over the window main body.

A surface of the second contamination preventing layer has greater hydrophobicity than a surface of the window main body and a surface of the light blocking layer.

The second contamination preventing layer is simultaneously formed with the contamination preventing layer.

Another embodiment provides a display device including a display panel including a display area for displaying an image and a non-display area neighboring the display area, and a window coupled to the display panel by a resin.

Yet another embodiment provides a method for manufacturing a window which is to cover a display panel including a display area for displaying an image and a non-display area neighboring the display area. The method includes: providing a window main body including a major surface, and further including a transmitting area corresponding to the display area when viewed in a viewing direction perpendicular to the major surface and a blocking area neighboring the transmitting area when viewed in the viewing direction and corresponding to the non-display area; forming a light blocking layer corresponding to the blocking area on the window main body; forming a guide block layer over the transmitting area and the blocking area such that there is an uncovered region where the guide block layer does not cover the window main body when viewed in the viewing direction, wherein the uncovered region is located between at least a portion of the transmitting area and at least a portion of the blocking area when viewed in the viewing direction; forming a contamination preventing mother layer over the window main body; and removing the guide block layer from the window main body, thereby removing at least a portion of the contamination prevention mother layer.

The forming of a guide block layer is performed to partly expose the light blocking layer.

The forming of a guide block layer is performed to partly expose the window main body.

The forming of a light blocking layer is performed for the light blocking layer to include at least one exposure pattern for exposing the window main body in an island shape, and the forming of a guide block layer is performed to expose the exposure pattern.

Still another embodiment provides a method for manufacturing a display device, including: providing a display panel including a display area for displaying an image and a non-display area neighboring the display area; manufacturing a window according to the foregoing window manufacturing method; and attaching the window to the display panel by using a resin.

According to one of the embodiments, the window that is easily laminated on the display panel by using a resin, the window manufacturing method, the display device, and the display device manufacturing method are provided.

DETAILED DESCRIPTION

Figure 1:
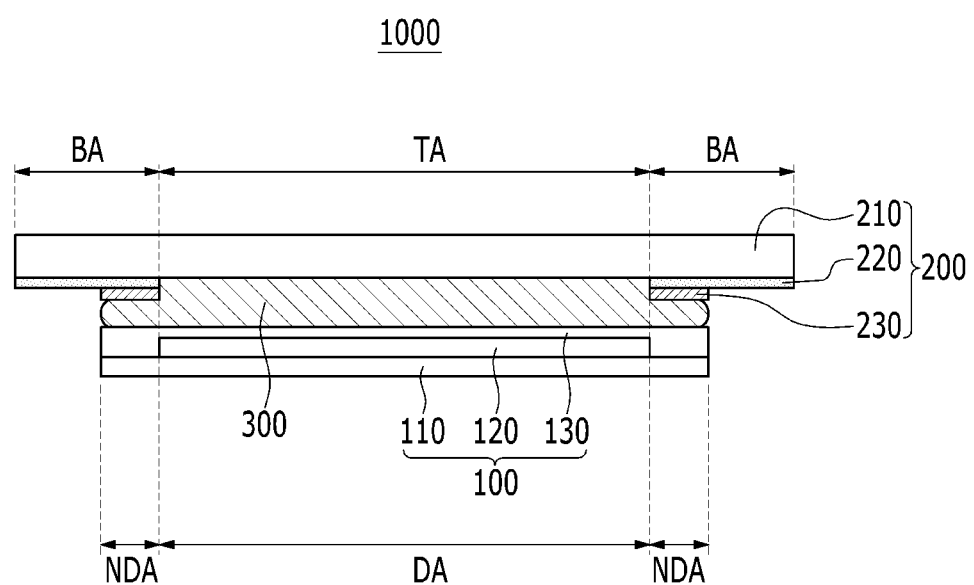
FIG. 1 shows a cross-sectional view of a display device according to a first exemplary embodiment.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in exemplary embodiments, like reference numerals designate like elements having the same configuration, and a first exemplary embodiment is representatively described, and in other exemplary embodiments, only configurations different from the first exemplary embodiment will be described.

In addition, the size and thickness of each component shown in the drawings are arbitrarily shown for better understanding and ease of description, but the present invention is not limited thereto.

In the drawings, the thickness of layers, films, panels, regions, etc., are exaggerated for clarity. Further, the thicknesses of some layers and regions are exaggerated in the drawings for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, it will be understood that when an element such as a layer, film, region, or substrate is referred to as being "on" another element, it can be directly on the other element or intervening elements may also be present.

A display device according to a first exemplary embodiment will now be described with reference to FIG. 1 to FIG. 3.

FIG. 1 shows a cross-sectional view of a display device according to a first exemplary embodiment.

As shown in FIG. 1, the display device 1000 includes a display panel 100, a window 200, and a resin 300.

The display panel 100 includes a display area (DA) for displaying an image and a non-display area (NDA) neighboring the display area (DA). The non-display area (NDA) has a closed loop form or shape which surrounds the display area (DA) when viewed in a first direction perpendicular to a display surface of the display panel. The display panel 100 includes a substrate 110, an organic light emitting element 120, and a thin film encapsulation layer 130.

The substrate 110 includes glass, resin, or metal, and is made of a light-transmissive, light-reflective, light-absorptive, or light-semi-transmissive material. The organic light emitting element 120 is provided on the substrate 110, and the substrate 110 encapsulates the organic light emitting element 120 together with the thin film encapsulation layer 130 with the organic light emitting element 120 therebetween. The substrate 110 and the thin film encapsulation layer 130 protect the organic light emitting element 120 from external interference. The substrate 110 can be flexible and the thin film encapsulation layer 130 is simultaneously formed to be a thin film so the entire display panel 100 can be flexible. The organic light emitting element 120 is provided on the substrate 110, and it emits light to display an image.

A touch sensor can be formed in or attached to the thin film encapsulation layer 130.

The display panel 100 includes the organic light emitting element 120, and a display panel according to another exemplary embodiment can include liquid crystal or plasma.

Figure 2:
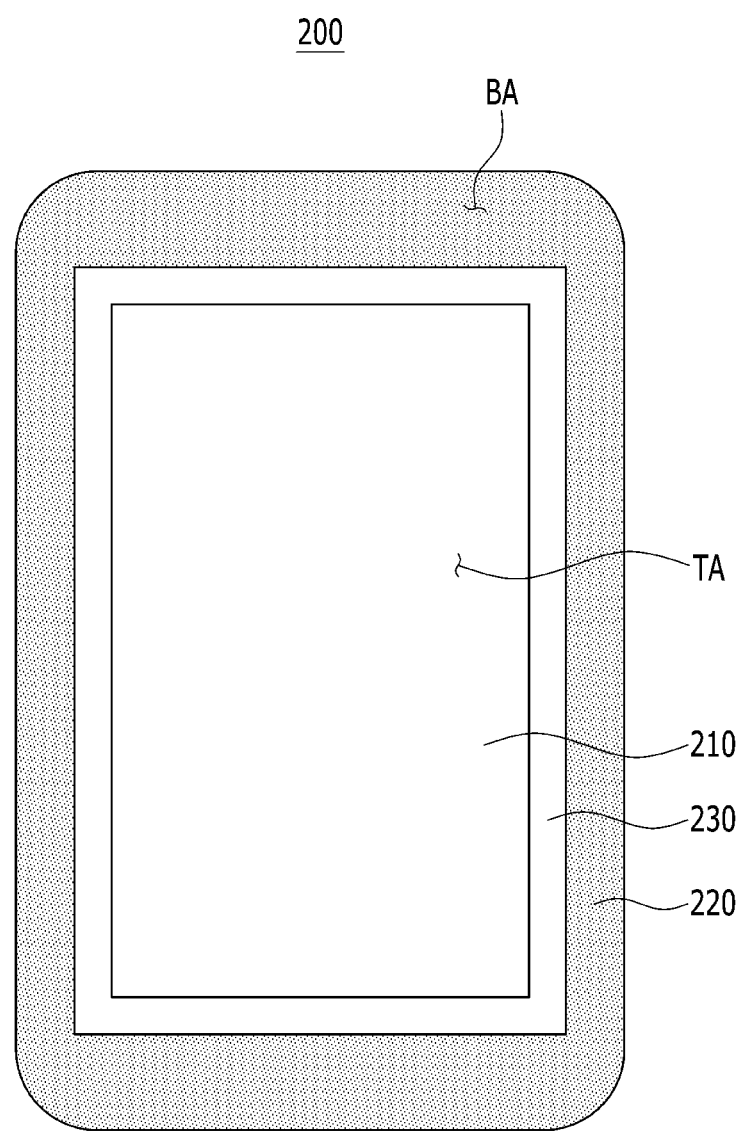
FIG. 2 shows a top plan view of a window shown in FIG. 1.

FIG. 2 shows a top plan view of the window shown in FIG. 1.

As shown in FIG. 1 and FIG. 2, the window 200 is provided on the display panel 100, and it is laminated on or coupled to the display panel 100 by a resin 300 that can be an optically clear adhesive.

The window 200 includes a window main body 210, a light blocking layer 220, and a contamination preventing layer 230.

The window main body 210 includes a transmitting area (TA) corresponding to the display area (DA) of the display panel 100, and a blocking area (BA) neighboring the transmitting area (TA) and corresponding to the non-display area (NDA). The blocking area (BA) has a closed loop form or shape which surrounds the transmitting area (TA) when viewed in a second direction perpendicular to a major surface of the window. The window main body 210 faces the display panel 100 and is made of a transparent material. The window main body 210 is made of a transparent material such as glass or resin, and it protects the display panel 100 so that the display panel 100 may not be broken by an external impact. The window main body 210 faces the display panel 100 and covers it. The window main body 210 is laminated on or attached to the display panel 100 by the resin 300 provided between the display panel 100 and the window 200, and it protects the display panel 100 together with the resin 300 to improve impact resistance of the display device 1000. The window main body 210 is formed to be wider than the display panel 100, and without being restricted to this, it can have a size that is substantially equivalent to the display panel 100.

The light blocking layer 220 is provided on the window main body 210 between the window main body 210 and the display panel 100, corresponding to the blocking area (BA). The light blocking layer 220 blocks external light to prevent the non-display area (NDA) of the display panel 100 from being visible to the outside. The light blocking layer 220 includes a metal material such as chromium (Cr) or an organic material including a black pigment.

The contamination preventing layer 230 is provided on a space or region of the window main body 210, the space or region being located between a central portion of the transmitting area (TA) and a peripheral portion of the blocking area (BA) when viewed in the second direction. In some embodiments, the space or region may be located adjacent a borderline between the transmitting area (TA) and the blocking area (BA) when viewed in the second direction. In other embodiments, the space or region may be located to overlap and cover the borderline between the transmitting area (TA) and the blocking area (BA) when viewed in the second direction. In one embodiment, the space or region may be located near or at the border line between the transmitting area (TA) and the blocking area (BA) when viewed in the second direction. The contamination preventing layer 230 contacts the resin 300 and the light blocking layer 220. The contamination preventing layer 230 corresponds to the space between the central portion of the transmitting area (TA) and the peripheral portion of the blocking area (BA) when viewed in the second direction and is coated on the light blocking layer 220 neighboring the transmitting area (TA). Since the contamination preventing layer 230 corresponds to the space or region and is coated on the light blocking layer 220 neighboring the transmitting area (TA), it is controlled for the resin 300 to pass over the contamination preventing layer 230 and flow to the edges of the display panel 100.

Particularly, in consideration of the resin flowing to the edges of the display panel 100, the contamination preventing layer 230 has a closed loop form along the edges of the display area (DA) and is provided on the window main body 210 so that the resin 300 is prevented from passing over the contamination preventing layer 230 and flowing to the edges of the display panel 100 when the window 200 is laminated on or attached to the display panel 100 by using the resin 300.

Figure 3:
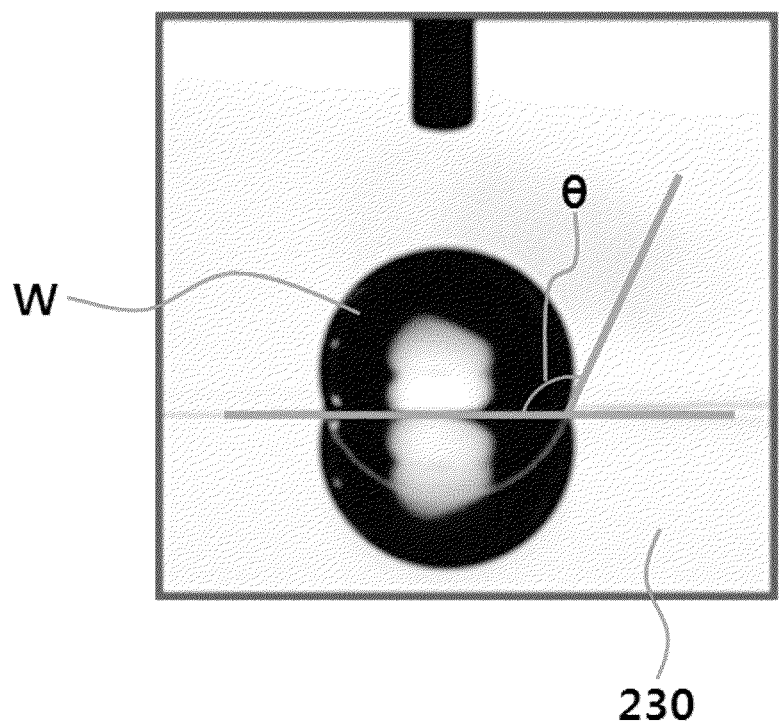
FIG. 3 shows a photo for showing a contact angle of a contamination preventing layer shown in FIG. 2.

FIG. 3 shows a photo for showing a contact angle of a contamination preventing layer shown in FIG. 2.

In detail, as shown in FIG. 3, a surface of the contamination preventing layer 230 contacting the resin 300 has greater hydrophobicity than a surface of the window main body 210 and a surface of the light blocking layer 220, and in further detail, the surface of the contamination preventing layer 230 has a contact angle (θ) of about 100 to about 200 degrees with respect to water (W). To have the hydrophobicity, the contamination preventing layer 230 includes fluorine (F). For example, the contamination preventing layer 230 may include silica and perfluorinated acid (PFA), may include a siloxane radical and a perfluorine radical, or may include a fluorine-based graft copolymer.

Therefore, regarding the display device 1000 according to the first embodiment, the window 200 laminated on the display panel 100 by the resin 300 includes the contamination preventing layer 230 with the surface having hydrophobicity, thereby preventing the resin 300 from passing over the contamination preventing layer 230 and flowing to the edges of the display panel 100, and when a fixable foreign substance is condensed on the contamination preventing layer 230, the fixable foreign substance is easily peeled from the window 200 through a cleansing process. That is, the reliability of the process for manufacturing the display device 1000 and product reliability are improved.

A method for manufacturing a display device according to a second exemplary embodiment will now be described with reference to FIG. 4 to FIG. 8. The display device according to the first exemplary embodiment can be manufactured by the method for manufacturing a display device according to the second exemplary embodiment.

Figure 4:
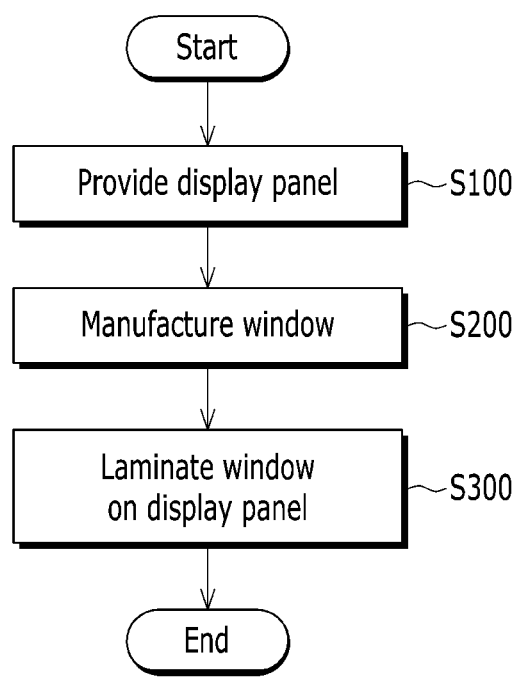
FIG. 4 shows a flowchart of a method for manufacturing a display device according to a second exemplary embodiment.

FIG. 4 shows a flowchart of a method for manufacturing a display device according to a second exemplary embodiment. FIG. 5 to FIG. 8 show a method for manufacturing a display device according to a second exemplary embodiment.

Figure 5:
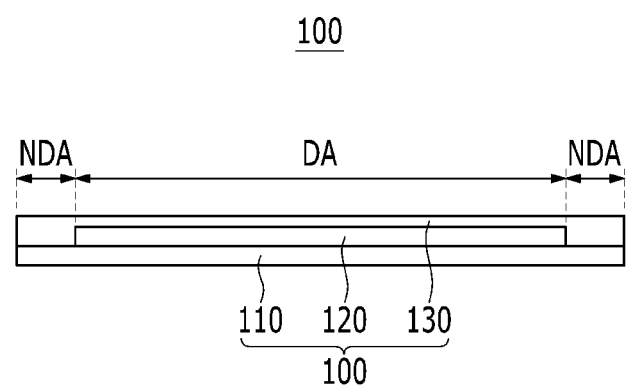
FIG. 5 to FIG. 8 show a method for manufacturing a display device according to a second exemplary embodiment.

As shown in FIG. 4 and FIG. 5, a display panel 100 is provided (S100).

In detail, an organic light emitting element 120 and a thin film encapsulation layer 130 are formed on a substrate 110 to form a display area (DA) for displaying an image and a display panel 100 including a non-display area (NDA) neighboring the display area (DA).

Figure 6:
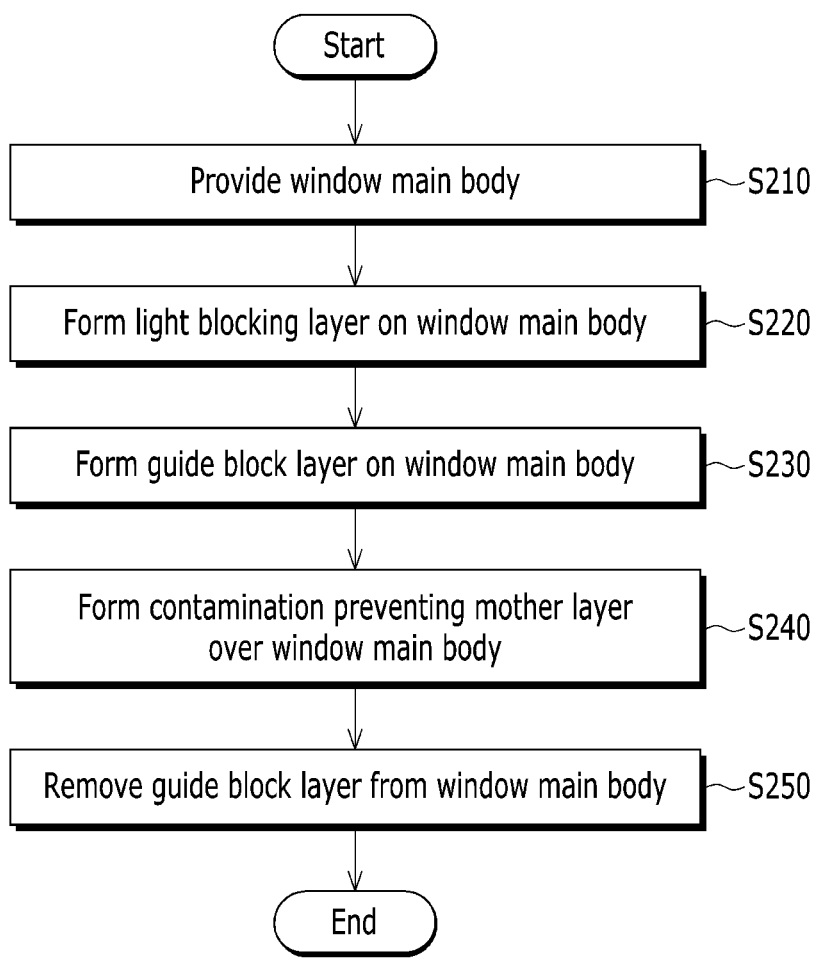
Figure 7:
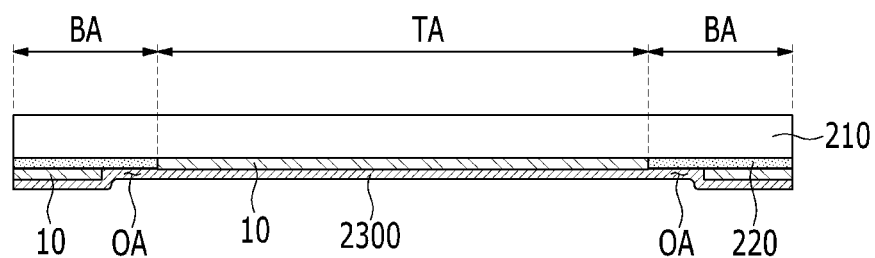

As shown in FIG. 6 and FIG. 7, a window is manufactured (S200).

A method for manufacturing a window will now be described.

A window main body 210 is provided (S210).

In detail, the window main body 210 including a transmitting area (TA) and a blocking area (BA) neighboring the transmitting area (TA) is provided.

A light blocking layer 220 is formed on the window main body 210 (S220).

In detail, the light blocking layer 220 is formed in the blocking area (BA) of the window main body 210.

A guide block layer 10 is formed on the window main body 210 (S230).

In embodiments, the guide block layer 10 defines an open area (OA) for exposing the light blocking layer 220.

In the method for manufacturing the window according to another exemplary embodiment, the open area (OA) of the guide block layer 10 can expose the window main body 210. In this case, a contamination preventing layer formed from a contamination preventing mother layer 2300 to be described can contact the window main body 210.

The contamination preventing mother layer 2300 is formed over the window main body 210 (S240).

In detail, the contamination preventing mother layer 2300 is formed over the window main body 210 so as to cover the surface of the guide block layer 10 and the open area (OA).

The guide block layer 10 is removed from the window main body 210 (S250).

In detail, the guide block layer 10 is lifted off from the window main body 210 to form a contamination preventing layer 230 contacting the light blocking layer 220 corresponding to a space between the transmitting area (TA) and the blocking area (BA).

Figure 8:
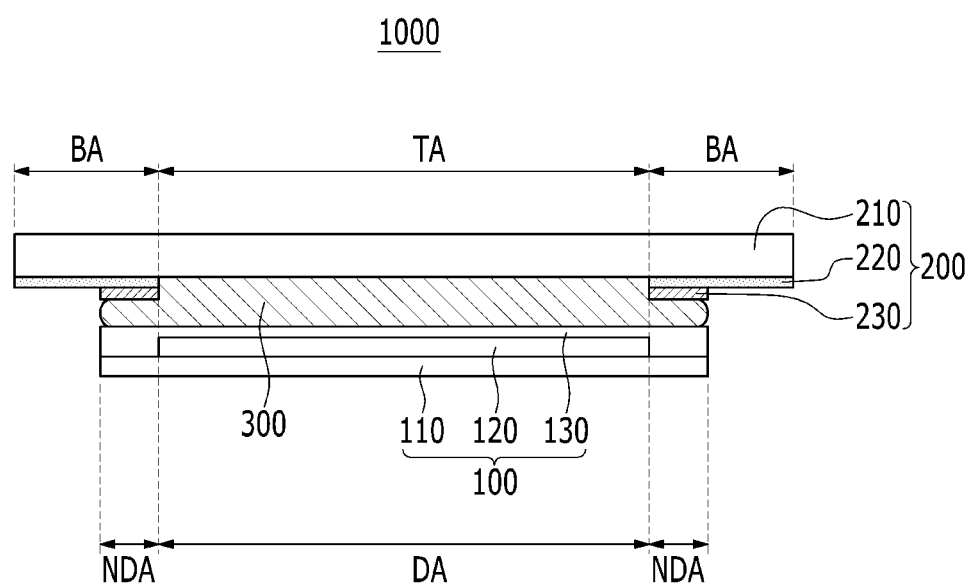

As shown in FIG. 8, the window 200 formed through the above-described process is laminated on the display panel 100 (S300).

In detail, a resin 300 is disposed between the window 200 and the display panel 100 to attach the window 200 to the display panel 100 by using the resin 300. In this instance, since the contamination preventing layer 230 corresponds to the space overlapping at least one of the transmitting area (TA) and the blocking area (BA) of the window 200 when viewed in the second direction and contacts the light blocking layer 220, an amount of the resin 300 protruded to the edges of the display panel 100 is easily controlled and undesired flowing of the resin 300 down to the edges of the display panel 100 is controlled.

Figure 9:
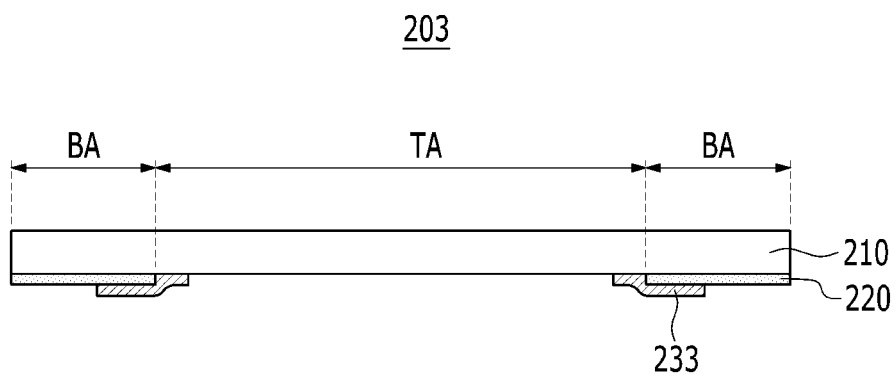
FIG. 9 shows a cross-sectional view of a window according to a third exemplary embodiment.

Referring to FIG. 9, a window according to a third exemplary embodiment will now be described.

Parts that are different from the first exemplary embodiment will be described, and parts that are not described follow the first exemplary embodiment. For better comprehension and ease of description, the same constituent elements according to the third exemplary embodiment as the first exemplary embodiment will have the same reference numerals.

FIG. 9 shows a cross-sectional view of a window according to a third exemplary embodiment.

As shown in FIG. 9, the window 203 is provided on the display panel 100, and it is laminated on or attached to the display panel 100 by the resin 300 that can be an optically clear adhesive.

The window 203 includes a window main body 210, a light blocking layer 220, and a contamination preventing layer 233.

The contamination preventing layer 233 corresponds to the space between the transmitting area (TA) and the blocking area (BA), and is provided on the window main body 210. The contamination preventing layer 233 contacts the resin 300 and also contacts the light blocking layer 220 and the window main body 210. The contamination preventing layer 233 corresponds to the space covering the boundary line between the transmitting area (TA) and the blocking area (BA) when viewed in the second direction, and it is coated up to the window main body 210 neighboring the blocking area (BA) from the light blocking layer 220 neighboring the transmitting area (TA). Therefore, since the contamination preventing layer 233 corresponds to the space covering the boundary line between the transmitting area (TA) and the blocking area (BA) when viewed in the second direction and it is coated on the light blocking layer 220 neighboring the transmitting area (TA) and the window main body 210 neighboring the blocking area (BA), it is controlled for the resin 300 to pass over the contamination preventing layer 233 and flow to the display panel 100.

Particularly, in consideration of the resin flowing to the edges of the display panel 100, the contamination preventing layer 233 has a closed loop form extended along the edges of the display area (DA) corresponding to the space between the transmitting area (TA) and the blocking area (BA) and is provided on the window main body 210 so the resin 300 is prevented from passing over the contamination preventing layer 233 and flowing to the edges of the display panel 100 when the window 203 is laminated on the display panel 100 by using the resin 300.

Therefore, the window 203 includes the contamination preventing layer 233 the surface of which has hydrophobicity so when the window 203 is laminated on the display panel 100 by the resin 300, it is controlled for the resin 300 to pass over the contamination preventing layer 233 and flow down to the edges of the display panel 100 and it is also controlled for a fixable foreign substance to be condensed on the contamination preventing layer 233.

A window according to a fourth exemplary embodiment will now be described with reference to FIG. 10 and FIG. 11.

Parts that are different from the first exemplary embodiment will be described and parts that are not described will follow the first exemplary embodiment. For better comprehension and ease of description, the same constituent elements according to the fourth exemplary embodiment as the first exemplary embodiment will have the same reference numerals.

Figure 10:
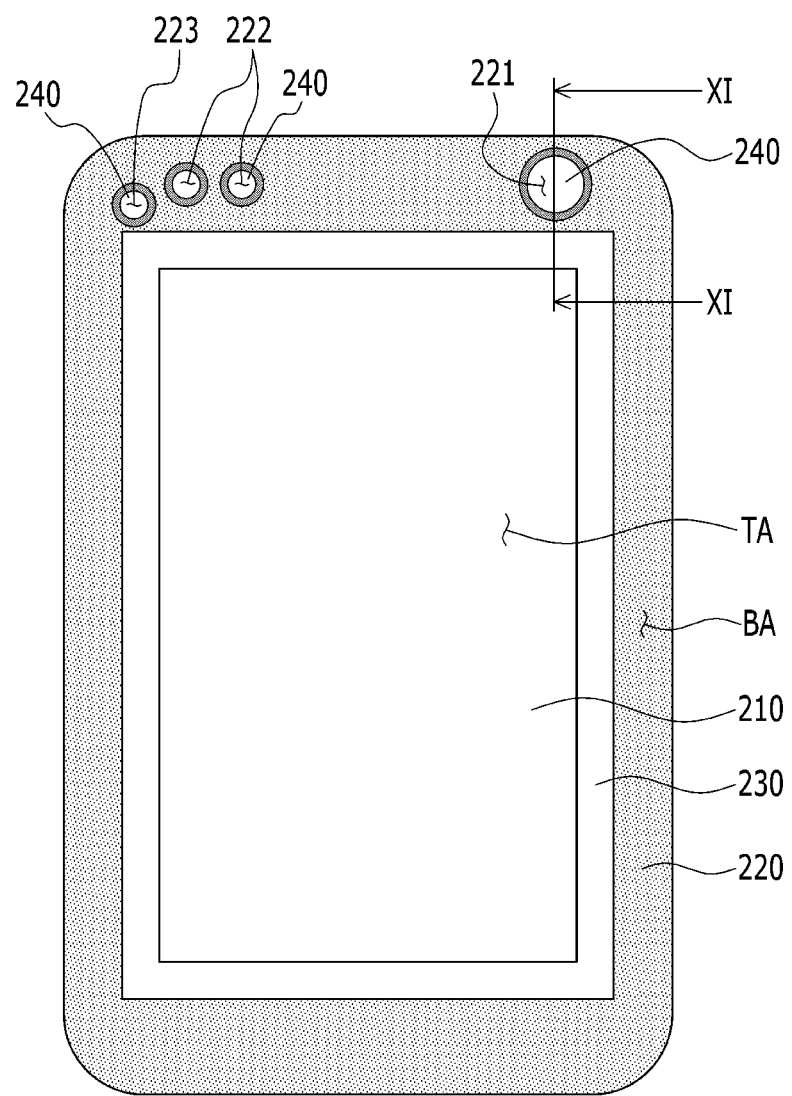
FIG. 10 shows a top plan view of a window according to a fourth exemplary embodiment.
Figure 11:
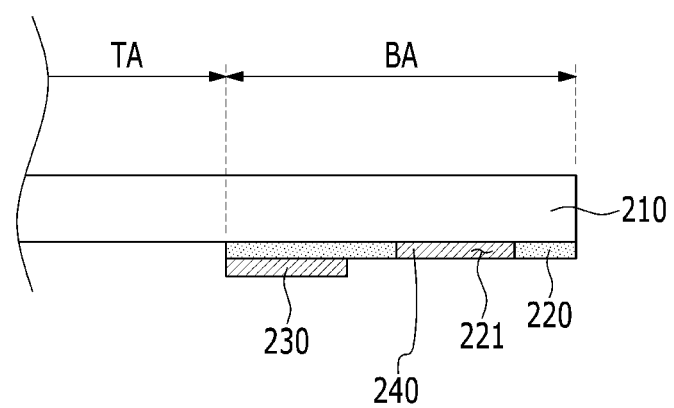
FIG. 11 shows a cross-sectional view with respect to a line XI-XI of FIG. 10.

FIG. 10 shows a top plan view of a window according to a fourth exemplary embodiment. FIG. 11 shows a cross-sectional view with respect to a line XI-XI of FIG. 10.

As shown in FIG. 9 and FIG. 10, the window 204 is provided on the display panel 100 and it is laminated on the display panel 100 by the resin 300 that can be an optically clear adhesive.

The window 204 includes a window main body 210, a light blocking layer 220, a contamination preventing layer 230, and a contamination preventing pattern 240.

The light blocking layer 220 defines a first exposure pattern or hole 221 for exposing the window main body 210 in an island shape or form, a second exposure pattern or hole 222, and a third exposure pattern or hole 223. The first exposure pattern 221, the second exposure pattern 222, and the third exposure pattern 223 are formed corresponding to a camera module, an infrared ray sensor module, and a light emitting diode (LED) that can be provided on the rear side of the window 204, and a lens of the camera module receives external light through the first exposure pattern 221, infrared rays of the infrared rays sensor module are transmitted to the outside through the second exposure pattern 222, and light of the light emitting diode is transmitted to the outside through the third exposure pattern 223.

The contamination preventing pattern 240 is provided on the window main body 210 respectively corresponding to the first exposure pattern 221, the second exposure pattern 222, and the third exposure pattern 223. The contamination preventing pattern 240 is coated on the window main body 210 respectively corresponding to the first exposure pattern 221 to the third exposure pattern 223. Since the contamination preventing pattern 240 is coated on the window main body 210 respectively corresponding to the first exposure pattern 221 to the third exposure pattern 223, it is controlled for stains or foreign substances to be condensed on the first exposure pattern 221 to the third exposure pattern 223 and contaminate the first exposure pattern 221 to the third exposure pattern 223.

In detail, the surface of the contamination preventing pattern 240 has greater hydrophobicity than the surface of the window main body 210 and the surface of the light blocking layer 220 in a like manner of the contamination preventing layer 230, and in further detail, the surface of the contamination preventing pattern 240 has a contact angle of 100 to 200 degrees with respect to water. To have such hydrophobicity, the contamination preventing pattern includes fluorine (F). For example, the contamination preventing pattern 240 may include silica and perfluorinated acid (PFA), may include a siloxane radical and a perfluorine radical, or may include a fluorine-based graft copolymer. That is, the contamination preventing pattern 240 is simultaneously formed with the contamination preventing layer 230.

Therefore, regarding the window 204 according to the fourth embodiment, the contamination preventing pattern 240 is coated on the window main body 210 respectively corresponding to the first exposure pattern 221 to the third exposure pattern 223 to control condensation of stains or foreign substances on the first exposure pattern 221 to the third exposure pattern 223.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A window for covering a display panel comprising a display area configured to display an image and a non-display area neighboring the display area, the window comprising:
   a plate comprising a major surface, wherein the plate further comprises a transmitting area and a blocking area, the transmitting area corresponding to the display area when viewed in a viewing direction perpendicular to the major surface, and the blocking area surrounding the transmitting area when viewed in the viewing direction and corresponding to the non-display area;

a light blocking layer provided over the blocking area of the plate; and a contamination preventing layer provided over at least a portion of the blocking area and surrounding the transmitting area when viewed in the viewing direction such that the contamination preventing layer forms a barrier to inhibit liquid resin from flowing thereover when bonding the plate to the display panel using the liquid resin.

2. The window of claim 1, wherein a surface of the contamination preventing layer has greater hydrophobicity than a surface of the plate and a surface of the light blocking layer.

3. The window of claim 2, wherein the surface of the contamination preventing layer has a contact angle of about 100 to about 200 degrees with respect to water.

4. The window of claim 2, wherein the contamination preventing layer comprises fluorine (F).

5. The window of claim 1, wherein the contamination preventing layer has a closed loop shape extending along an edge of the transmitting area of the plate.

6. The window of claim 5, wherein the contamination preventing layer contacts the light blocking layer.

7. The window of claim 5, wherein the contamination preventing layer extends to the plate.

8. The window of claim 1, wherein the light blocking layer defines at least one exposure hole through which a portion of the plate is exposed for light transmission in the middle of the light blocking layer when viewed in the viewing direction, and the window further comprises a second contamination preventing layer provided in the exposure hole and over the plate.

9. The window of claim 8, wherein a surface of the second contamination preventing layer has greater hydrophobicity than a surface of the plate and a surface of the light blocking layer.

10. The window of claim 8, wherein the second contamination preventing layer is simultaneously formed with the contamination preventing layer.

11. A display device comprising:

a display panel comprising a display area configured to display an image and a non-display area surrounding the display area; and the window of claim 1 and coupled to the display panel by a resin.

12. A method for manufacturing a window which is to cover a display panel comprising a display area for displaying an image and a non-display area neighboring the display area, the method comprising:

providing a plate comprising a major surface, and further comprising a transmitting area and a blocking area, the transmitting area corresponding to the display area when viewed in a viewing direction perpendicular to the major surface, the blocking area surrounding the transmitting area when viewed in the viewing direction and corresponding to the non-display area;

forming a light blocking layer over the blocking area of the plate;

forming a masking layer over the transmitting area and a first portion of the light blocking layer with an opening that exposes a second portion of the light blocking area;

forming a contamination preventing mother layer over the masking layer including over the second portion of the light blocking area; and subsequently removing the masking layer and a portion of the contamination prevention mother layer to leave a contamination preventing layer provided over the second portion of the light blocking area and surrounding the transmitting area when viewed in the viewing direction such that the contamination preventing layer forms a barrier to inhibit liquid resin from flowing thereover when bonding the plate to the display panel using the liquid resin.

13. The method of claim 12, wherein the forming of a guide block layer is performed to partly expose the light blocking layer.

14. The method of claim 12, wherein the forming of a guide block layer is performed to partly expose the window main body.

15. A method for manufacturing a display device, the method comprising:

providing a display panel comprising a display area for displaying an image and a non-display area surrounding the display area;

manufacturing a window according to the window manufacturing method of claim 12; and attaching the window to the display panel using a resin.

* * * * *